(12) United States Patent
Kim et al.

(10) Patent No.: US 9,370,097 B2
(45) Date of Patent: Jun. 14, 2016

(54) PACKAGE SUBSTRATE WITH TESTING PADS ON FINE PITCH TRACES

(71) Applicant: QUALCOMM Incorporated, San Diego, CA (US)

(72) Inventors: Chin-Kwan Kim, San Diego, CA (US); Kuiwon Kang, Seoul (KR); Omar James Bchir, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 399 days.

(21) Appl. No.: 13/783,168

(22) Filed: Mar. 1, 2013

(65) Prior Publication Data
US 2014/0247573 A1 Sep. 4, 2014

(51) Int. Cl.
| | |
|---|---|
| H05K 7/10 | (2006.01) |
| H05K 1/11 | (2006.01) |
| G01R 31/28 | (2006.01) |
| H05K 1/02 | (2006.01) |
| H05K 3/34 | (2006.01) |

(52) U.S. Cl.
CPC ............ *H05K 1/111* (2013.01); *G01R 31/2818* (2013.01); *H05K 1/0268* (2013.01); *H05K 3/3452* (2013.01); *H05K 2201/10674* (2013.01); *Y10T 29/49004* (2015.01); *Y10T 29/4913* (2015.01); *Y10T 29/49124* (2015.01)

(58) Field of Classification Search
USPC .......... 361/774, 767, 808; 257/738, 691, 693; 174/251
See application file for complete search history.

(56) References Cited

U.S. PATENT DOCUMENTS

| | | | |
|---|---|---|---|
| 6,969,674 B2 | 11/2005 | Chang et al. | |
| 7,569,935 B1* | 8/2009 | Fan | H01L 24/16 257/737 |
| 8,272,120 B2 | 9/2012 | Gruber et al. | |
| 2008/0048695 A1 | 2/2008 | Ashida | |
| 2010/0012356 A1 | 1/2010 | Hasegawa | |
| 2012/0043672 A1 | 2/2012 | Cho et al. | |
| 2012/0252168 A1 | 10/2012 | Nah et al. | |
| 2014/0138831 A1* | 5/2014 | Jomaa | H01L 21/563 257/750 |

OTHER PUBLICATIONS

Partial International Search Report—PCT/US2014/018372—ISA/EPO—Jul. 4, 2014.
International Search Report and Written Opinion—PCT/US2014/018372—ISA/EPO—Sep. 10, 2014.
International Search Report and Written Opinion—PCT/US2014/018372—ISA/EPO—Mar. 20, 2015.

* cited by examiner

*Primary Examiner* — Andargie M Aychillhum
(74) *Attorney, Agent, or Firm* — Loza & Loza, LLP

(57) ABSTRACT

Some implementations provide a substrate that includes several traces, a solder resist layer covering the several traces, and a testing pad coupled to a trace from the several traces. The testing pad is at least partially exposed and at least partially free of the solder resist layer when a chip is coupled to the substrate. In some implementations, the several traces have a pitch that is 100 microns (μm) or less. In some implementations, the substrate is a package substrate. In some implementations, the package substrate is a package substrate on which a thermal compression flip chip is mounted during an assembly process. In some implementations, the testing pad is free of a direct connection with a bonding component of the chip when the chip is coupled to the substrate. In some implementations, the bonding component is one of a solder ball.

31 Claims, 12 Drawing Sheets

PACKAGE SUBSTRATE WITH TESTING PADS ON FINE PITCH TRACES

BACKGROUND

1. Field

Various features relate to a package substrate with testing pads on fine pitch traces.

2. Background

A thermal compression bonding process is a process used to assemble/package a flip chip, die or semiconductor device to a package substrate. Such a flip chip is often referred to as a thermal compression flip chip (TCFC). Thermal compression bonding processes provide several advantages over traditional bonding processes. For example, thermal compression bonding processes are generally more accurate than other solder bonding processes. Thus, thermal compression bonding processes are ideal when using fine pitch traces on a substrate (e.g., less than 100 microns (μm)). In contrast, other solder bonding processes are limited to a bonding pitch that is greater than 100 microns (μm). Thus, TCFCs are typically higher density chips than chips using other bonding processes.

However, testing package substrates having fine pitch traces (e.g., 100 microns (μm) or less) can be challenging and difficult due to the small size of the pitches of the traces. Specifically, fine pitch traces may result in misalignment when pins of a testing device are connected to the traces on the substrate. FIG. 1 illustrates such an example. Specifically, FIG. 1 conceptually illustrates a package substrate 100 that includes several fine pitch traces 102. FIG. 1 also illustrates several testing pins 104 being electrically coupled to the traces 102. As shown in FIG. 1, the testing pins 104 are not aligned with the traces 102. The result of this misalignment is that the package substrate may not be properly tested.

Therefore, there is a need for an improved method for testing package substrates with fine pitch traces. Ideally, such a solution will be cost effective and reduce testing errors due to misalignment of testing pins of a testing device.

SUMMARY

Various features relate to a package substrate with testing pads on fine pitch traces.

A first example provides a substrate that includes several traces, a solder resist layer covering the several traces, and a testing pad coupled to a trace from the several traces. The testing pad is at least partially exposed and at least partially free of the solder resist layer when a chip is coupled to the substrate.

According to an aspect, the several traces have a pitch that is 100 microns (μm) or less. In some implementations, the substrate is a package substrate. In some implementations, the package substrate is a package substrate on which a fine pitch flip chip is mounted during an assembly process. In some implementations, the fine pitch flip chip is a thermo-compression flip chip. In some implementations, the fine pitch flip chip is a mass reflow flip chip.

According to one aspect, the testing pad is free of a direct connection with a bonding component of the chip when the chip is coupled to the substrate. In some implementations, the bonding component is one of a solder ball. In some implementations, the bonding component is one of a solder ball.

According to an aspect, the testing pad is a via pad that traverses at least part of the substrate.

According to one aspect, the testing pad has a width that is larger than the width of the trace to which the testing pad is coupled to.

According to an aspect, the testing pad is configured to couple to a pin of a testing device during testing of the substrate.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a substrate that includes several traces, a solder resist layer covering the several traces, and a means for testing the substrate. The means for testing is coupled to a trace from the several traces. The means for testing is at least partially exposed and at least partially free of the solder resist layer when a chip is coupled to the substrate.

According to an aspect, the several traces have a pitch that is 100 microns (μm) or less. In some implementations, the substrate is a package substrate. In some implementations, the package substrate is a package substrate on which a fine pitch flip chip is mounted during an assembly process. In some implementations, the fine pitch flip chip is a thermo-compression flip chip. In some implementations, the fine pitch flip chip is a mass reflow flip chip.

According to one aspect, the means for testing is free of a direct connection with a bonding component of the chip when the chip is coupled to the substrate. In some implementations, the bonding component is one of a solder ball. In some implementations, the bonding component is one of a solder ball.

According to an aspect, the means for testing is a via pad that traverses at least part of the substrate.

According to one aspect, the means for testing has a width that is larger than the width of the trace to which the testing pad is coupled to.

According to an aspect, the means for testing is configured to couple to a pin of a testing device during testing of the substrate.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a substrate. The method provides a substrate that includes several traces. The method provides a solder resist layer covering the several traces. The method removes a portion of the solder resist layer to at least partially expose at least one testing pad, the testing pad being at least partially exposed and at least partially free of the solder resist layer when a chip is coupled to the substrate.

According to an aspect, the method further couples the substrate to the chip such that the testing pad remains at least partially exposed and at least partially free of the solder resist layer.

According to an aspect, the several traces have a pitch that is 100 microns (μm) or less. In some implementations, the substrate is a package substrate. In some implementations, the package substrate is a package substrate on which a fine pitch flip chip is mounted during an assembly process. In some implementations, the fine pitch flip chip is a thermo-compression flip chip. In some implementations, the fine pitch flip chip is a mass reflow flip chip.

According to one aspect, the testing pad is free of a direct connection with a bonding component of the chip when the chip is coupled to the substrate. In some implementations, the bonding component is one of a solder ball. In some implementations, the bonding component is one of a solder ball.

According to an aspect, the testing pad is a via pad that traverses at least part of the substrate.

According to one aspect, the testing pad has a width that is larger than the width of the trace to which the testing pad is coupled to.

According to an aspect, the testing pad is configured to couple to a pin of a testing device during testing of the substrate.

According to one aspect, the method further incorporates the substrate into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a substrate that includes several traces, a solder resist layer covering the several traces, and a testing pad coupled to a trace from the several traces. The testing pad is at least partially exposed and at least partially free of the solder resist layer when a chip is coupled to the substrate. In some implementations, the several traces have a pitch that is 100 microns (μm) or less. In some implementations, traces that have a pitch of 100 microns (μm) or less may be referred as fine pitch traces. In some implementations, the substrate is a package substrate. In some implementations, the package substrate is a package substrate on which a thermal compression flip chip is mounted during an assembly process. In some implementations, the package substrate is a package substrate on which a mass reflow flip chip is mounted during an assembly process. In some implementations, the testing pad is free of a direct connection with a bonding component of the chip when the chip is coupled to the substrate. In some implementations, the bonding component is one of a solder ball.

Exemplary Sequence for Manufacturing a Package Substrate With Testing Pads

Figure 1:
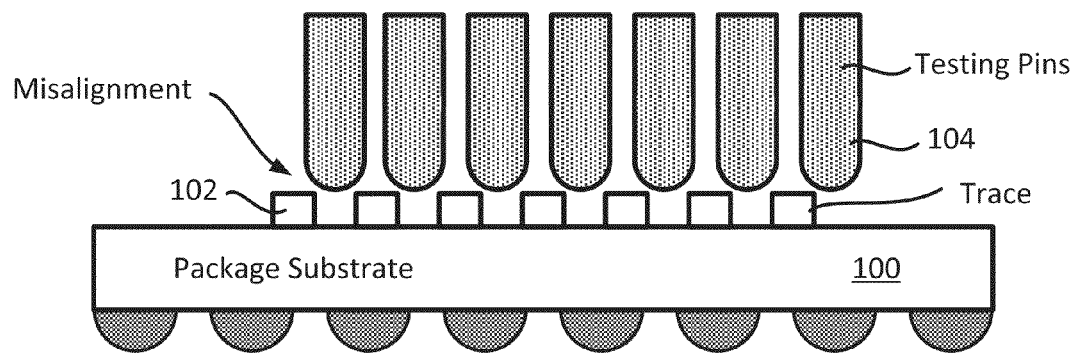
FIG. 1 illustrates a package substrate that includes several fine pitch traces.
Figure 2A:
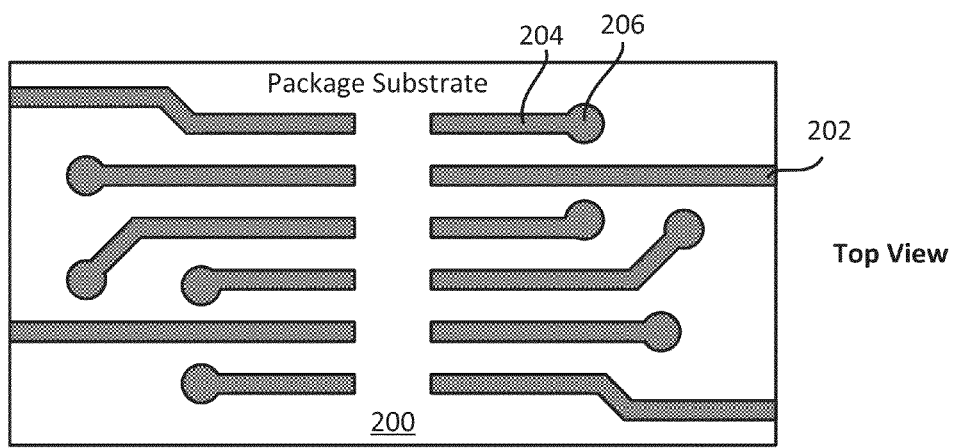
FIGS. 2A-2B illustrate a top view sequence for manufacturing a package substrate that includes testing pads on fine pitch traces.
Figure 2B:
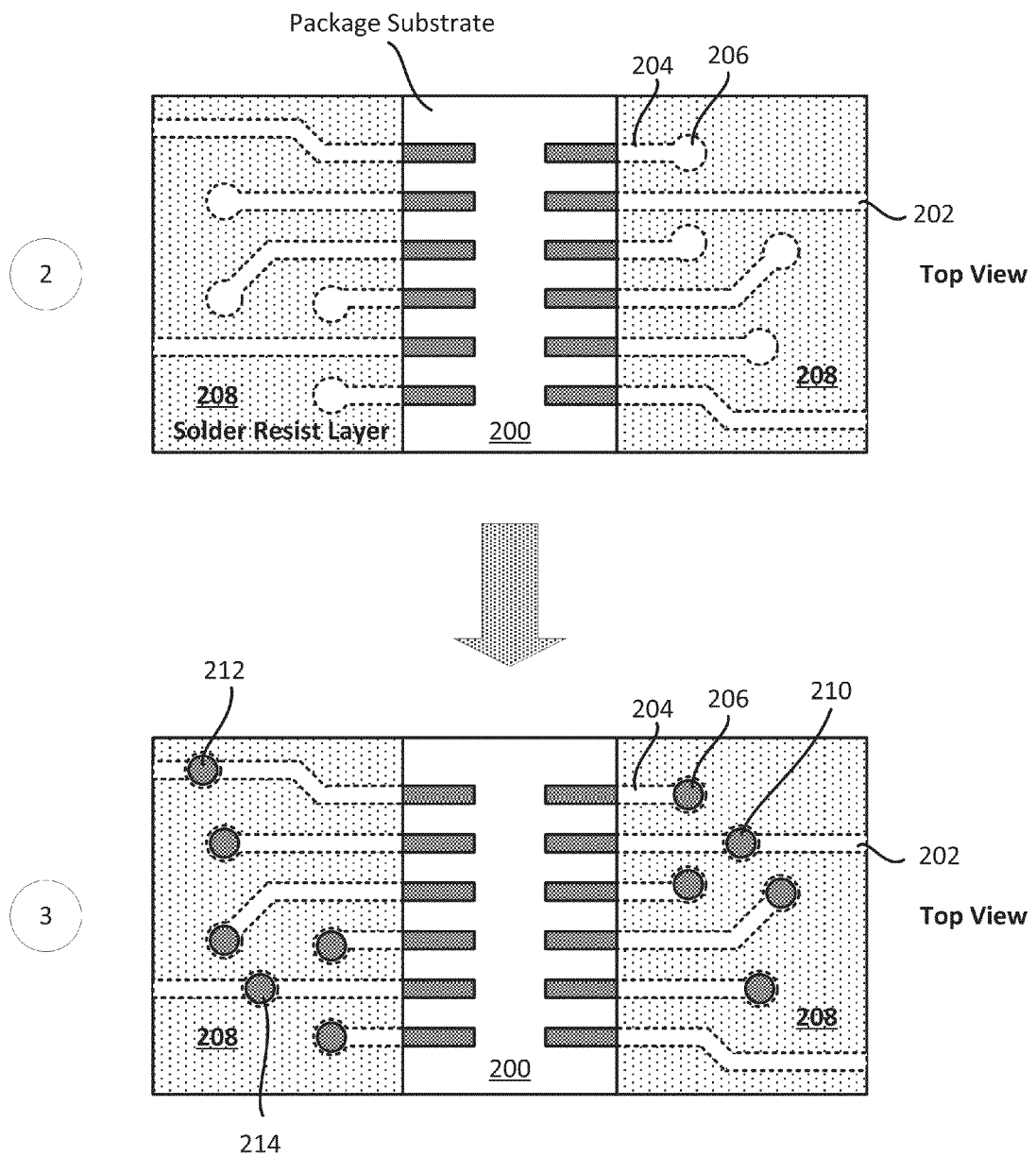

FIGS. 2A-2B conceptually illustrate a top view sequence of how a package substrate that includes fine pitch traces can be manufactured in order to reduce misalignment during testing of the package substrate. Specifically, FIGS. 2A-2B illustrate a top view sequence for manufacturing a package substrate that includes testing pads on fine pitch traces. In some implementations, fine pitch traces are traces that have a pitch of 100 microns (μm) or less. A pitch of a trace may be a center to center distance between tow neighboring traces. In some implementations, the package substrate is a package substrate on which a fine pitch flip chip is mounted on during an assembly process. In some implementations, a fine pitch flip chip may be a flip chip/die that has an input/output (I/O) connection pitch of 100 microns (μm) or less. In some implementations, an I/O connection pitch of a flip chip is a center to center distance between two neighboring I/O connections (e.g., under bump metallization (UBM) structures, bumps). In some implementations, these I/O connections are interconnects that are coupled to traces (e.g., fine pitch traces) on a package substrate. Examples of a fine pitch flip chip may include a thermo-compression/thermal compression flip chip/die and mass reflow flip chip/die in some implementations.

As shown in FIG. 2A, at stage 1, a package substrate 200 includes several traces (e.g., traces 202-204) and several pads (e.g., via pad 206) at the end of at least some of the traces. The traces are fine pitch traces that have a pitch of 100 microns (μm) or less. In some implementations, a trace pitch defines a center to center distance between two neighboring traces.

As further shown in FIG. 2B, at stage 2, the package substrate 200 is at least partially covered with a solder resist layer 208. At stage 2, the pads (e.g., via pad 206) and some portions of the traces are covered with the solder resist layer 208, leaving other portions of the traces exposed (e.g., leaving other portions of the traces free of the solder resist layer 208). Thus, stage 2 of FIG. 2B illustrates traces (e.g., trace 202) that include a covered portion (e.g., covered with the solder resist layer 208) and an exposed portion (e.g., free of the solder resist layer 208). In some implementations, the exposed portion of the trace is the portion of the trace that a die (e.g., thermal compression flip chip) is coupled to during an assembly process of a die to the package substrate 200. For example, in some implementations, the exposed portion of the trace is the portion of the trace that a bonding component (e.g., solder ball) of the die is coupled to during an assembly process of a die to the package substrate 200 (e.g., when a die is mounted on the package substrate).

At stage 3 of FIG. 2B, the package substrate 200 includes testing pads that a pin of a testing device may couple to during testing of the package substrate 200. As shown in stage 3, some or all of the pads (e.g., via pad 206) are now at least partially exposed and no longer covered with the solder resist layer 208 (at least partially free of the solder resist layer 208). Once the solder resist layer 208 above the pads has been removed (e.g., etched), the pads may function as testing pads configured to couple to testing pins of a testing device during the testing of the package substrate. Different implementations may remove the solder resist layer 208 above the pads (e.g., via pad 206) differently. In some implementations, an etching process may be used (e.g., using laser etching) to selectively remove portions of the solder resist layer 208.

Some traces (e.g., trace 202) may initially not have any via pads. For example, trace 202 at stage 1 does not include any via pads. In some implementations, a pad (e.g. testing pad) may be added to a trace after a solder resist layer has been provided (e.g., deposited) on the package substrate 200. As shown at stage 3 of FIG. 2B, several testing pads (e.g., testing pads 210-214) have been added to the package substrate 200 after the solder resist layer 208 has been provided. The testing pads 210-214 are at least partially exposed and are not covered by the solder resist layer 208 (at least partially free of the solder resist layer 208). In some implementations, the testing pads 210-214 are configured to couple to a pin of a testing device during testing of the substrate.

Different implementations may add/create/manufacture the testing pads differently. In some implementations, a portion of the solder resist layer 208 above a portion of a trace (e.g., trace 202) is etched away, leaving an opening in the solder resist layer 208 and exposing a portion of the trace (e.g., portion of trace 202). A metal layer/component (e.g., copper) is then deposited/added to the portion of the package substrate and trace that is left exposed as a result of the removing (e.g., etching) of the solder resist layer 208.

FIGS. 2A-2B conceptually illustrate a top view of how a package substrate that includes fine pitch traces can be manufactured in order to reduce misalignment during testing of the package substrate. However, the sequence and process is not limited to a package substrate. Consequently, the sequence and process can be applied to other substrates as well. A sequence and process for manufacturing a similar package substrate that includes fine pitch traces will now be described from a side view perspective.

Figure 3A:
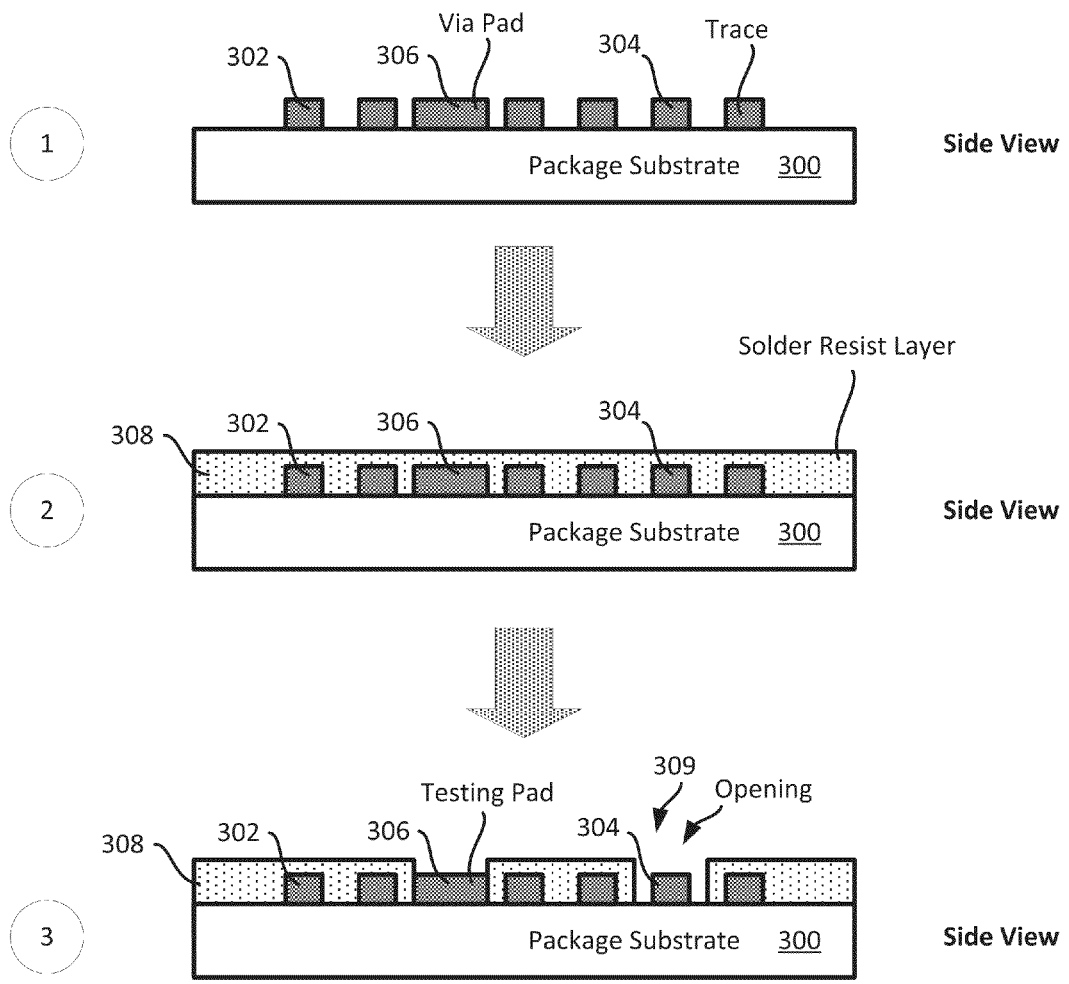
FIGS. 3A-3B illustrate a side view sequence for manufacturing a package substrate that includes testing pads on fine pitch traces.
Figure 3B:
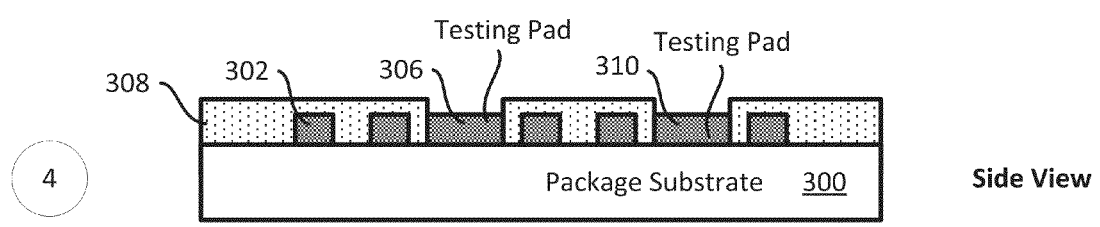

FIGS. 3A-3B conceptually illustrate a side view sequence of how a package substrate that includes fine pitch traces can be manufactured in order to reduce misalignment during testing of the package substrate. Specifically, FIGS. 3A-3B illustrate a side view sequence for manufacturing a package substrate that includes testing pads on fine pitch traces. In some implementations, the package substrate of FIGS. 3A-3B is a package substrate on which a fine pitch flip chip is mounted on during an assembly process. In some implementations, a fine pitch flip chip may be a flip chip that has an input/output (I/O) connection pitch of 100 microns (μm) or less. In some implementations, an I/O connection pitch of a flip chip/die is a center to center distance between two neighboring I/O connections (e.g., under bump metallization (UBM) structures, bumps). In some implementations, these I/O connections are interconnects that are coupled to traces (e.g., fine pitch traces) on a package substrate. Examples of a fine pitch flip chip may include a thermo-compression/thermal compression flip chip/die and mass reflow flip chip/die in some implementations.

As shown in FIG. 3A, at stage 1, a package substrate 300 includes several traces (e.g., traces 302-304) and at least one pad (e.g., via pad 306) at the end of at least some of the traces. The traces are fine pitch traces that have a pitch of 100 microns (μm) or less. In some implementations, a pitch defines a center to center distance between two neighboring traces.

As shown at stage 2, the package substrate 300 is at least partially covered with a solder resist layer 308. Although not visible from a side view, at stage 2, the pads (e.g., via pad 306) and some portions of the traces are covered with the solder resist layer 308, leaving other portions of the traces exposed (e.g., leaving other portions of the traces free of the solder resist layer 308). Thus, stage 2 of FIG. 3A illustrates traces (e.g., trace 302) that include a covered portion (e.g., covered with the solder resist layer 308) and an exposed portion (e.g., free of the solder resist layer 308). In some implementations, the exposed portion of the trace is the portion of the trace that a die (e.g., thermal compression flip chip) is coupled to during an assembly process of a die to the package substrate 300. For example, in some implementations, the exposed portion of the trace is the portion of the trace that a bonding component (e.g., solder ball) of the die is coupled to during an assembly process of a die to the package substrate 300 (e.g., when a die is mounted on the package substrate).

At stage 3 of FIG. 3A, the package substrate 300 includes testing pads that a pin of a testing device may couple to during testing of the package substrate 300. As shown in stage 3, some or all of the pads (e.g., via pad 306) are now at least partially exposed and no longer covered with the solder resist layer 308 (at least partially free of the solder resist layer 308). Once the solder resist layer 308 above the pads has been removed (e.g., etched), the pads may function as testing pads configured to couple to testing pins of a testing device during the testing of the package substrate. Different implementations may remove the solder resist layer 308 above the pads (e.g., via pad 306) differently. In some implementations, an etching process may be used (e.g., using laser etching) to selectively remove portions of the solder resist layer 308.

Some traces (e.g., trace 304) may initially not have any via pads. For example, trace 304 does not include any via pads. In some implementations, a pad (e.g. testing pad) may be added to a trace after a solder resist layer has been provided (e.g., deposited) on the package substrate 300. As shown at stage 3, an opening 309 in the solder resist layer 308 has been created above a portion of the trace 304. In some implementations, the opening 309 is created by removing (e.g., etching) a portion of the solder resist layer 308.

As shown at stage 4 of FIG. 3B, a testing pad 310 has been added to the package substrate 300 after the solder resist layer 308 has been provided. In some implementations, the testing pad 310 is created by a metal layer/component (e.g., copper) that is deposited/added to the portion of the package substrate 300 and trace 304 that is left exposed as a result of the removing (e.g., etching) of the solder resist layer 308. The testing pad 310 is at least partially exposed and is not covered by the solder resist layer 308 (at least partially free of the solder resist layer 308). In some implementations, the testing pad 310 is configured to couple to a pin of a testing device during testing of the substrate. Different implementations may add/create/manufacture the testing pads differently.

FIGS. 3A-3B conceptually illustrate a side view of how a package substrate that includes fine pitch traces can be manufactured in order to reduce misalignment during testing of the package substrate. However, the sequence and process is not limited to a package substrate. Consequently, the sequence and process can be applied to other substrates as well.

A sequence and process for manufacturing a similar package substrate that includes fine pitch traces will now be described from top and side view perspectives to better illustrate exposed and covered portions of a package substrate.

FIGS. 4A-4D conceptually illustrate a top view and a side view sequence of how a package substrate that includes fine pitch traces can be manufactured in order to reduce misalignment during testing of the package substrate. Specifically, FIGS. 4A-4D illustrate a top view and a side view sequence for manufacturing a package substrate that includes testing pads on fine pitch traces. FIGS. 4A-4D is similar to FIGS. 3A-3B, except that it also includes a top view perspective. It should be noted that the side view of FIGS. 4A-4D is a cross section of the top view from the perspective of the A-A plane of the top view of FIGS. 4A-4D.

Figure 4A:
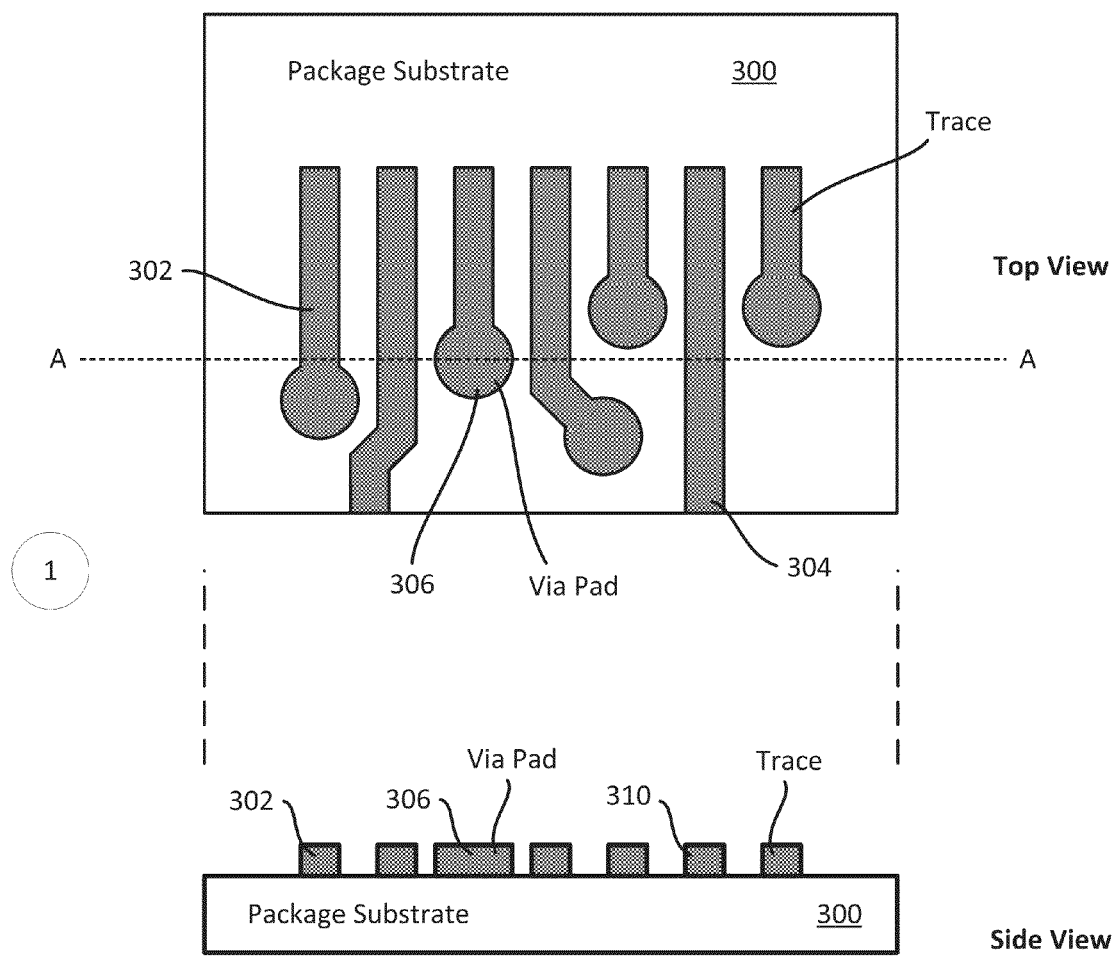
FIGS. 4A-4D illustrate another sequence for manufacturing a package substrate that includes testing pads on fine pitch traces.

As shown in FIG. 4A, at stage 1, a package substrate 400 includes several traces (e.g., traces 402-404) and at least one pad (e.g., via pad 406) at the end of at least some of the traces. The traces are fine pitch traces that have a pitch of 100 microns (μm) or less. In some implementations, a pitch defines a center to center distance between two neighboring traces.

Figure 4B:
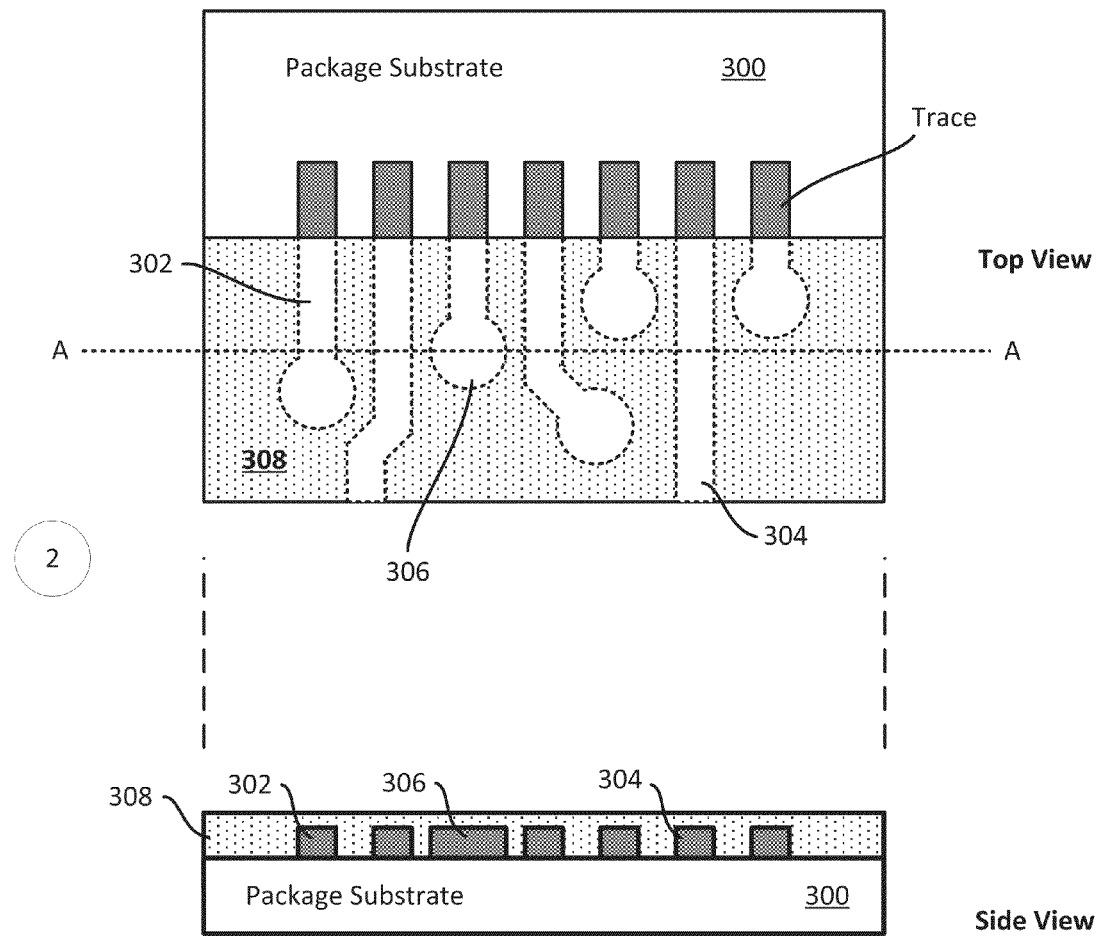

As shown in FIG. 4B, at stage 2, the package substrate 300 is at least partially covered with a solder resist layer 308. At stage 2, the pads (e.g., via pad 306) and some portions of the traces are covered with the solder resist layer 308, leaving other portions of the traces exposed (e.g., leaving other portions of the traces free of the solder resist layer 308). Thus, stage 2 of FIG. 4B illustrates traces (e.g., trace 302) that include a covered portion (e.g., covered with the solder resist layer 308) and an exposed portion (e.g., free of the solder resist layer 308). In some implementations, the exposed portion of the trace is the portion of the trace that a die (e.g., thermal compression flip chip) is coupled to during an assembly process of a die to the package substrate 300. For example, in some implementations, the exposed portion of the trace is the portion of the trace that a bonding component (e.g., solder ball) of the die is coupled to during an assembly process of a die to the package substrate 300 (e.g., when a die is mounted on the package substrate).

Figure 4C:
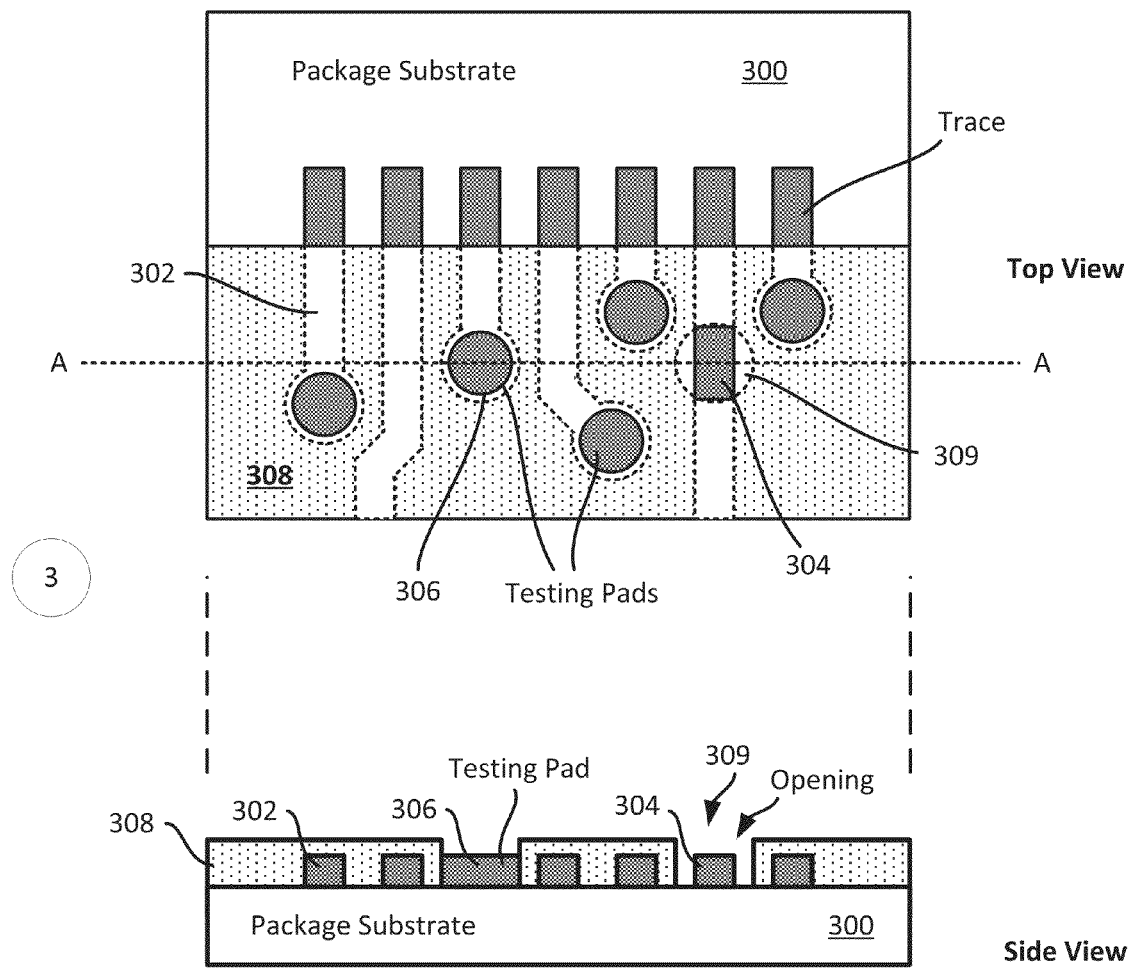

As shown at stage 3 of FIG. 4C, the package substrate 300 includes testing pads that a pin of a testing device may couple to during testing of the package substrate 300. As shown in stage 3, some or all of the pads (e.g., via pad 306) are now at least partially exposed and no longer covered with the solder resist layer 308 (at least partially free of the solder resist layer 308). Once the solder resist layer 308 above the pads has been removed (e.g., etched), the pads may function as testing pads configured to couple to testing pins of a testing device during the testing of the package substrate. Different implementations may remove the solder resist layer 308 above the pads (e.g., via pad 306) differently. In some implementations, an etching process may be used (e.g., using laser etching) to selectively remove portions of the solder resist layer 308.

Some traces (e.g., trace 304) may initially not have any via pads. For example, trace 304 does not include any via pads. In some implementations, a pad (e.g. testing pad) may be added to a trace after a solder resist layer has been provided (e.g., deposited) on the package substrate 300. As shown at stage 3, an opening 309 in the solder resist layer 308 has been created above a portion of the trace 304. In some implementations, the opening 309 is created by removing (e.g., etching) a portion of the solder resist layer 308.

Figure 4D:
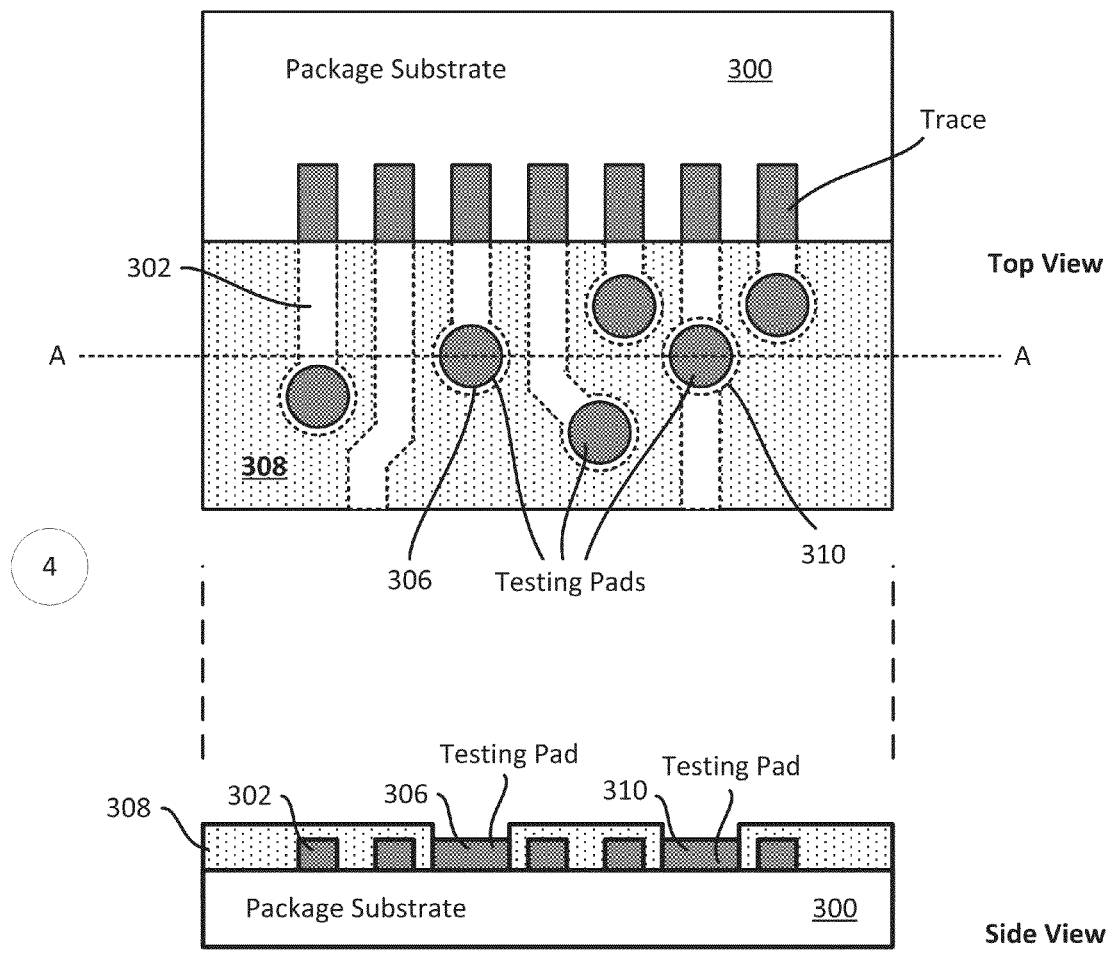

As shown at stage 4 of FIG. 4D, a testing pad 310 has been added to the package substrate 300 after the solder resist layer 308 has been provided. In some implementations, the testing pad 310 is created by a metal layer/component (e.g., copper) that is deposited/added to the portion of the package substrate 300 and trace 304 that is left exposed as a result of the removing (e.g., etching) of the solder resist layer 308. The testing pad 310 is at least partially exposed and is not covered by the solder resist layer 308 (at least partially free of the solder resist layer 308). In some implementations, the testing pad 310 is configured to couple to a pin of a testing device during testing of the substrate. Different implementations may add/create/manufacture the testing pads differently.

The sequence of FIGS. 4A-4D illustrates an example of a sequence for manufacturing testing pads on a package substrate. In some implementations, the package substrate of FIGS. 4A-4D is a package substrate on which a fine pitch flip chip is mounted on during an assembly process. In some implementations, a fine pitch flip chip may be a flip chip/die that has an input/output (I/O) connection pitch of 100 microns (μm) or less. In some implementations, an I/O connection pitch of a flip chip/die is a center to center distance between two neighboring I/O connections (e.g., under bump metallization (UBM) structures, bumps). In some implementations, these I/O connections are interconnects that are coupled to traces (e.g., fine pitch traces) on a package substrate. Examples of a fine pitch flip chip may include a thermo-compression/thermal compression flip chip/die and mass reflow flip chip/die in some implementations.

FIGS. 4A-4D conceptually illustrates top and side views of how a package substrate that includes fine pitch traces can be manufactured in order to reduce misalignment during testing of the package substrate. However, the sequence and process is not limited to a package substrate. Consequently, the sequence and process can be applied to other substrates as well.

Figure 5:
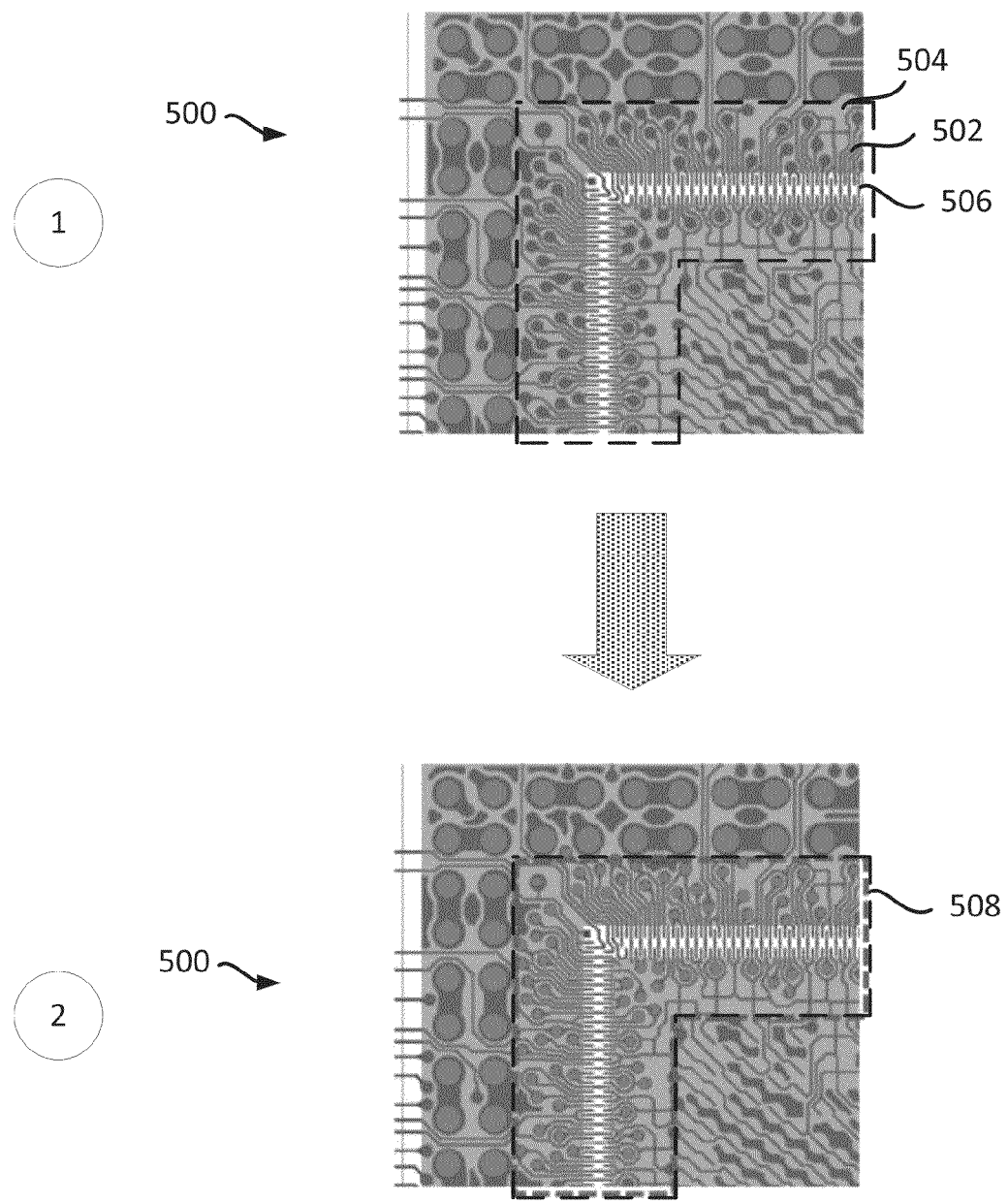
FIG. 5 illustrates a detailed view of a sequence for manufacturing a package substrate that includes testing pads on fine pitch traces.

FIG. 5 conceptually illustrates a more detailed top view of how a package substrate that includes fine pitch traces can be manufactured in order to reduce misalignment during testing of the package substrate. As shown in FIG. 5, during stage 1, a package substrate 500 includes several traces (e.g., trace 502) and several pads. These traces are fine pitch traces having a pitch of 100 microns (μm) or less. The pads may be via pads in some implementations. FIG. 5 also illustrates that a solder resist layer 504 covering some portions of some of the traces, leaving other portions of the traces exposed (e.g., leaving other portions of the traces free of the solder resist layer 504). For example, a region 506 of the package substrate is exposed and free of the solder resist layer 504. In some implementations, the exposed region 506 is the region of the package substrate 500 that a die/chip (e.g., thermal compression flip chip) is coupled to during an assembly process of a die/chip to a package substrate.

Stage 2 of FIG. 5 illustrates the package substrate 500 that includes testing pads that a testing pin of a testing device may couple to during testing of the package substrate. As shown in stage 2, some or all of the pads (e.g., via pads) in region 508 of the package substrate 500 are now at least partially exposed and no longer covered with the solder resist layer 504 (at least partially free of the solder resist layer). In some implementations, one or more of these exposed pads are testing pads on which pins of a testing device may be coupled to during a test of the package substrate. Different implementations may remove the solder resist layer 504 above the pads (e.g., via pads) differently. In some implementations, an etching process may be used (e.g., using laser etching) to selectively remove portions of the solder resist layer 504.

The sequence of FIG. 5 illustrates an example of a shortened sequence for manufacturing testing pads on a package substrate. In some implementations, the package substrate of FIG. 5 is a package substrate on which a fine pitch flip chip is mounted on during an assembly process. In some implementations, a fine pitch flip chip may be a flip chip/die that has an input/output (I/O) connection pitch of 100 microns (μm) or less. In some implementations, an I/O connection pitch of a flip chip/die is a center to center distance between two neighboring I/O connections (e.g., under bump metallization (UBM) structures, bumps). In some implementations, these I/O connections are interconnects that are coupled to traces (e.g., fine pitch traces) on a package substrate. Examples of a fine pitch flip chip may include a thermo-compression/thermal compression flip chip/die and mass reflow flip chip/die in some implementations.

Having described various examples of a package substrate that includes testing pads on fine pitch traces, a method for manufacturing a package substrate that includes testing pads on fine pitch traces will now be described below.

Exemplary Method for Manufacturing a Package Substrate With Testing Pads

Figure 6:
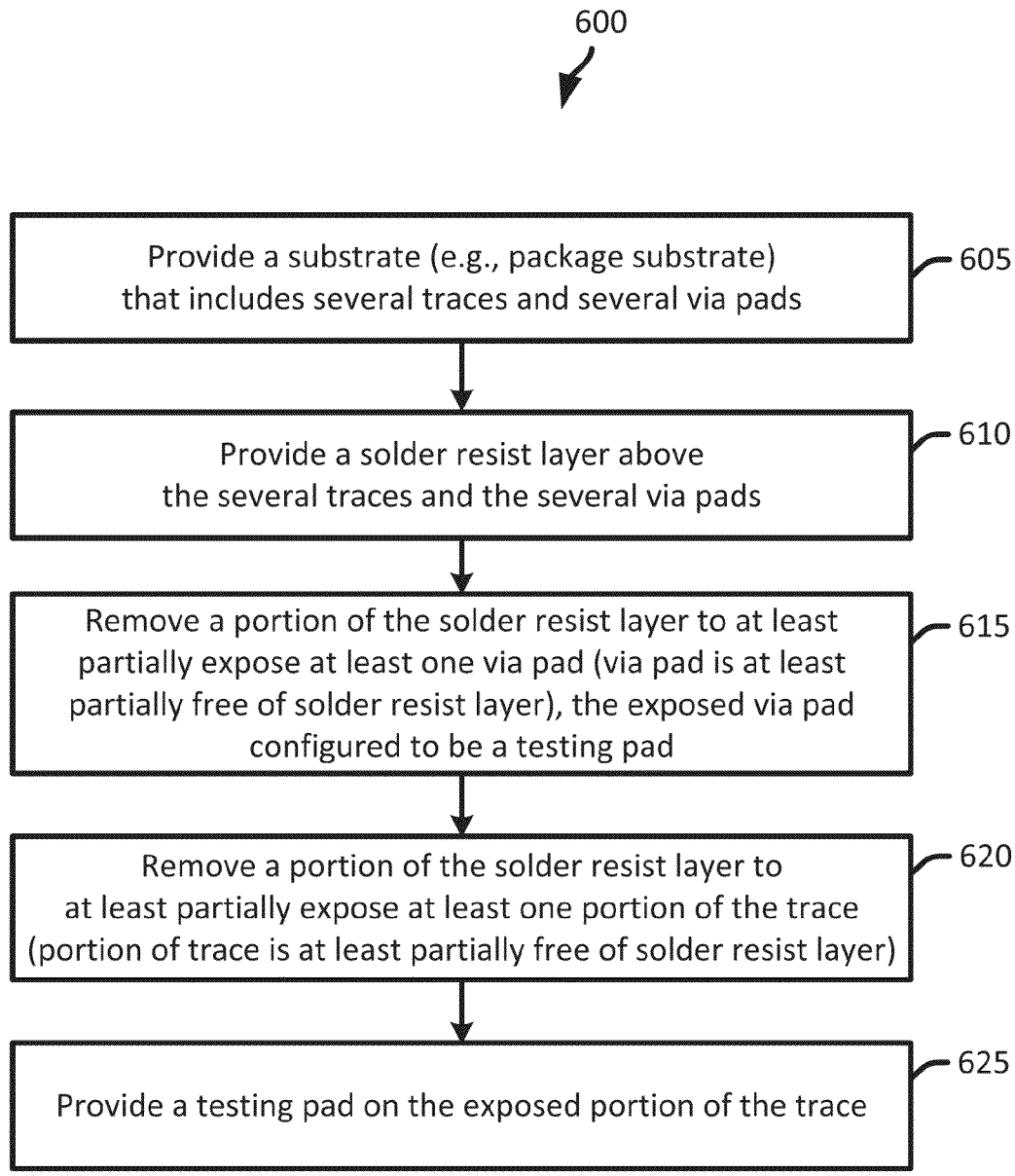
FIG. 6 illustrates a flow diagram for manufacturing a package substrate that includes testing pads on fine pitch traces.

FIG. 6 illustrates a flow diagram for providing/manufacturing a package substrate that includes testing pads on fine pitch traces. The method provides (at 605) a substrate (e.g., package substrate) that includes several traces and several pads (e.g., via pads). In some implementations, the substrate is a package substrate on which a thermal compression flip chip is mounted during an assembly process. FIGS. 2A and 4A illustrate examples of providing a substrate that includes several traces and several pads (e.g., via pads). In some implementations, the traces are fine pitch traces that have a pitch of 100 microns (μm) or less. In some implementations, a trace pitch defines a center to center distance between two neighboring traces.

The method provides (at 610) a solder resist layer above the several traces and the several pads of the substrate. In some implementations, only a portion of the substrate (e.g., package substrate) is covered by the solder resist layer. Consequently, in some implementations, only a portion of the traces on the substrate may be covered by the solder resist layer. Stage 2 of FIG. 2B and FIG. 4B illustrate examples of providing a solder resist layer above several traces and several pads (e.g., via pads).

The method removes (at 615) a portion of the solder resist layer to at least partially expose at least one pad (e.g., via pad). Different implementations may remove the solder resist layer to expose a pad differently. In some implementations, an etching process may be used (e.g., using laser etching) to selectively remove portions of the solder resist layer. In some implementations, removing a portion of the solder resist layer creates an opening in the solder resist layer above the pad (e.g., via pad) The exposed pad is at least partially free of the solder resist layer. The exposed pad (e.g., exposed via pad) is configured to be a testing pad configured to couple to a pin of a testing device during testing of the substrate. In some implementations, the testing pad is free of a direct connection with a bonding component of a die (e.g., flip chip) when the die is coupled to the substrate. Stage 3 of FIG. 2B and FIG. 4C illustrate examples of removing a portion of a solder resist layer to expose a pad (e.g., via pad).

The method removes (at 620) a portion of the solder resist layer to at least partially expose one portion of a trace. Different implementations may remove the solder resist layer to expose a portion of a trace differently. In some implementations, an etching process may be used (e.g., using laser etching) to selectively remove portions of the solder resist layer. In some implementations, removing a portion of the solder resist layer creates an opening in the solder resist layer above a portion of the trace. The exposed portion of the trace is at least partially free of the solder resist layer. In some implementations, removing (at 620) the portion of the solder resist layer to at least partially expose a portion of a trace is performed before or concurrently with removing (at 615) the portion of the solder resist layer to at least partially expose one or more pads (e.g., via pads). FIG. 4C illustrate an example of removing a portion of a solder resist layer to expose a portion of a trace.

The method provides (at 625) a testing pad on the at least partially exposed portion of the trace. Different implementations may provide the testing pad differently. In some implementations, the testing pad is provided (e.g., created) by a metal layer/component (e.g., copper) that is deposited/added to the portion of the package substrate and trace that is left exposed as a result of the removing (e.g., etching) of the solder resist layer (e.g., in the opening of the solder resist layer). In some implementations, the testing pad is at least partially exposed and is not covered by the solder resist layer (at least partially free of the solder resist layer. In some implementations, the testing pad is configured to couple to a pin of a testing device during testing of the substrate. In some implementations, the testing pad is free of a direct connection with a bonding component of a die (e.g., flip chip) when the die is coupled to the substrate. Stage 3 of FIG. 2B and FIG. 4D illustrate examples of providing testing pads on package substrate.

The method of FIG. 6 illustrates an example of a method for manufacturing a package substrate with testing pads. In some implementations, the package substrate is a package substrate on which a fine pitch flip chip is mounted on during an assembly process. In some implementations, a fine pitch flip chip may be a flip chip/die that has an input/output (I/O) connection pitch of 100 microns (μm) or less. In some implementations, an I/O connection pitch of a flip chip/die is a center to center distance between two neighboring I/O connections (e.g., under bump metallization (UBM) structures, bumps). In some implementations, these I/O connections are interconnects that are coupled to traces (e.g., fine pitch traces) on a package substrate. Examples of a fine pitch flip chip may include a thermo-compression/thermal compression flip chip/die and mass reflow flip chip/die in some implementations.

Exemplary Electronic Devices

Figure 7:
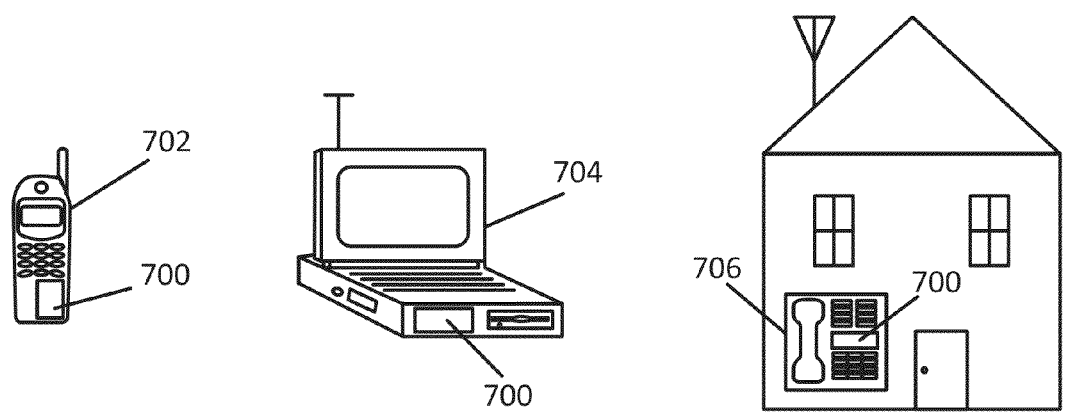
FIG. 7 illustrates various electronic devices that may be integrated with any of the aforementioned integrated circuit, die, chip, die package and/or substrate.

FIG. 7 illustrates various electronic devices that may be integrated with any of the aforementioned integrated circuit, die, chip or package. For example, a mobile telephone 702, a laptop computer 704, and a fixed location terminal 706 may include an integrated circuit (IC) 700 as described herein. The IC 700 may be, for example, any of the integrated circuits, dice or packages described herein. The devices 702, 704, 706 illustrated in FIG. 7 are merely exemplary. Other electronic devices may also feature the IC 700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof One or more of the components, steps, features, and/or functions illustrated in FIGS. 2A-2B, 3A-3B, 4A-4D, 5, 6 and/or 7 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "die package" is used to refer to an integrated circuit wafer that has been encapsulated or packaged or encapsulated.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
   a plurality of traces;
   a solder resist layer covering the plurality of traces; and
   a testing pad coupled to a trace from the plurality of traces, the testing pad configured to enable testing of the substrate in the absence of any component being mounted on the substrate, the testing pad being at least partially exposed and at least partially free of the solder resist layer when a chip is coupled to the substrate.

2. The substrate of claim 1, wherein the plurality of traces has a pitch that is 100 microns (μm) or less.

3. The substrate of claim 1, wherein the substrate is a package substrate.

4. The substrate of claim 1, wherein the trace coupled to the testing pad, comprises an exposed portion free of the solder resist layer, and on which the chip is mounted during an assembly process.

5. The substrate of claim 4, wherein the chip comprises a thermo-compression chip and/or a mass reflow chip.

6. The substrate of claim 1, wherein the testing pad is free of a direct connection with a bonding component of the chip when the chip is coupled to the substrate.

7. The substrate of claim 6, wherein the bonding component comprises a solder ball.

8. The substrate of claim 1, wherein the testing pad is a via pad that traverses at least part of the substrate.

9. The substrate of claim 1, wherein the testing pad has a width that is larger than the width of the trace to which the testing pad is coupled to.

10. The substrate of claim 1, wherein the testing pad is configured to couple to a pin of a testing device during testing of the substrate.

11. The substrate of claim 1, wherein the substrate is incorporated into a music player, a video player, an entertainment unit, a navigation device, a communications device, a mobile device, a mobile phone, a smartphone, a personal digital assistant, a fixed location terminal, a tablet computer, and/or a laptop computer.

12. A substrate comprising:
    a plurality of traces;
    a solder resist layer covering the plurality of traces; and
    a means for testing the substrate, the means for testing coupled to a trace from the plurality of traces, the means for testing configured to enable testing of the substrate in the absence of any component being mounted on the substrate, the means for testing being at least partially exposed and at least partially free of the solder resist layer when a chip is coupled to the substrate.

13. The substrate of claim 12, wherein the plurality of traces has a pitch that is 100 microns (μm) or less.

14. The substrate of claim 12, wherein the substrate is a package substrate.

15. The substrate of claim 12, wherein the trace coupled to the means for testing, comprises an exposed portion free of the solder resist layer, and on which the chip is mounted during an assembly process.

16. The substrate of claim 15, wherein the chip comprises a thermo-compression chip and/or a mass reflow chip.

17. The substrate of claim 12, wherein the means for testing is free of a direct connection with a bonding component of the chip when the chip is coupled to the substrate.

18. The substrate of claim 17, wherein the bonding component comprises a solder ball.

19. The substrate of claim 12, wherein the means for testing is a via pad that traverses at least part of the substrate.

20. The substrate of claim 12, wherein the means for testing has a width that is larger than the width of the trace to which the means for testing is coupled to.

21. The substrate of claim 12, wherein the means for testing is configured to couple to a pin of a testing device during testing of the substrate.

22. The substrate of claim 12, wherein the substrate is incorporated into a music player, a video player, an entertainment unit, a navigation device, a communications device, a mobile device, a mobile phone, a smartphone, a personal digital assistant, a fixed location terminal, a tablet computer, and/or a laptop computer.

23. A device comprising:
    a chip; and
    a substrate coupled to the chip, the substrate comprising:
       a plurality of traces;
       a solder resist layer covering the plurality of traces; and
       a testing pad coupled to a trace from the plurality of traces, the testing pad configured to enable testing of the substrate, the testing pad being at least partially exposed and at least partially free of the solder resist layer when the substrate is coupled to the chip, wherein the testing pad is free of direct physical coupling with a bonding component of the chip.

24. The device of claim 23, wherein the bonding component comprises a solder ball.

25. The device of claim 23, wherein the chip is coupled to an exposed portion of a first trace from the plurality of traces, through the bonding component.

26. The device of claim 23, wherein the plurality of traces has a center to center distance between two neighboring traces that is 100 microns (μm) or less.

27. The device of claim 23, wherein the chip is a flip chip, the substrate is a package substrate on which the flip chip is mounted to the plurality of traces during an assembly process.

28. The device of claim 23, wherein the chip comprises a thermo-compression flip chip and/or a mass reflow flip chip.

29. A device comprising:
   a chip; and
   a substrate coupled to the chip, the substrate comprising:
      a plurality of traces;
      a solder resist layer covering the plurality of traces; and
      a means for testing the substrate, the means for testing the substrate coupled to a trace from the plurality of traces, the means for testing the substrate configured to enable testing of the substrate, the means for testing the substrate being at least partially exposed and at least partially free of the solder resist layer when the substrate is coupled to the chip, wherein the means for testing the substrate is free of direct physical coupling with a bonding component of the chip.

30. The device of claim 29, wherein the bonding component comprises a solder ball.

31. The device of claim 29, wherein the chip is a flip chip, and the substrate is a package substrate on which the flip chip is mounted to the plurality of traces during an assembly process, and the plurality of traces has a center to center distance between two neighboring traces that is 100 microns (μm) or less.

* * * * *